(12) United States Patent
Hsiao et al.

(10) Patent No.: US 7,763,895 B2
(45) Date of Patent: Jul. 27, 2010

(54) FLEXIBLE LIGHT SOURCE DEVICE AND FABRICATION METHOD THEREOF

(75) Inventors: Zhi-Cheng Hsiao, Hsinchu County (TW); Chao-Kai Hsu, Hsinchu County (TW); Yu-Hua Chen, Nantou County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/422,291

(22) Filed: Apr. 13, 2009

(65) Prior Publication Data
US 2010/0163897 A1 Jul. 1, 2010

(30) Foreign Application Priority Data
Dec. 26, 2008 (TW) .............................. 97151124 A

(51) Int. Cl.
*H01L 29/267* (2006.01)
(52) U.S. Cl. ..................... 257/81; 438/25; 438/667; 257/698; 257/E23.011
(58) Field of Classification Search ............... 438/25, 438/667; 257/81, 698, E33.07, E23.011
See application file for complete search history.

(56) References Cited

U.S. PATENT DOCUMENTS

| | | | |
|---|---|---|---|
| 7,042,021 B2 * | 5/2006 | Isoda .......................... 257/98 |
| 7,273,291 B2 | 9/2007 | Kim et al. |
| 2005/0258436 A1 * | 11/2005 | Arai ............................. 257/81 |
| 2007/0217200 A1 | 9/2007 | Yang et al. |
| 2007/0246717 A1 * | 10/2007 | Ng ................................ 257/81 |
| 2008/0018556 A1 * | 1/2008 | Gregory ....................... 345/46 |
| 2008/0067526 A1 * | 3/2008 | Chew ........................... 257/88 |
| 2008/0112162 A1 | 5/2008 | Chan |
| 2008/0205012 A1 * | 8/2008 | Heinemann et al. ......... 361/767 |

* cited by examiner

*Primary Examiner*—Trung Dang
(74) *Attorney, Agent, or Firm*—Jianq Chyun IP Office

(57) ABSTRACT

A flexible light source device including a substrate, a light emitting device, a molding compound, a dielectric layer, and a metal line is provided. The substrate has a first surface, a second surface opposite to the first surface, and a first opening. The light emitting device is disposed on the first surface of the substrate and covers the first opening. The molding compound is located above the first surface and covers the light emitting device. The dielectric layer is disposed on the second surface and covers a sidewall of the first opening. The dielectric layer has a second opening which exposes part of the light emitting device. The metal line is disposed on the dielectric layer, wherein the metal line is electrically connected to the light emitting device via the second opening in the dielectric layer. Additionally, a fabrication method of the flexible light source device is also provided.

21 Claims, 3 Drawing Sheets

FLEXIBLE LIGHT SOURCE DEVICE AND FABRICATION METHOD THEREOF

CROSS-REFERENCE TO RELATED APPLICATION

This application claims the priority benefit of Taiwan application serial no. 97151124, filed on Dec. 26, 2008. The entirety of the above-mentioned patent application is hereby incorporated by reference herein and made a part of specification.

BACKGROUND OF THE INVENTION

1. Field of the Invention

The present invention generally relates to a light source device and a fabrication method thereof, and more particularly, to a flexible light source device and a fabrication method thereof.

2. Description of Related Art

Solid state lighting (SSL) has many advantages such as small volume, high anti-shock ability, low power consumption, long lifespan, and high color diversity and purity, etc. Thereby, SSL has been broadly applied to various products. Because the designs of most application products are going towards high portability, those flexible products will certainly bring more convenience in their being carried around.

A SSL chip is anon-directional light source and accordingly the light output thereof is very limited. Besides, because the substrate therein absorbs light, the extraction efficiency of the entire SSL chip is reduced. Conventionally, the substrate is transposed or a reflective surface is coated over the substrate in order to prevent the substrate from absorbing light. However, the flexibility of the substrate will be reduced by aforementioned approaches. Besides, a large-sized high-power SSL may be adopted to improve the extraction efficiency thereof. Even though the large-sized SSL offers a higher light emitting efficiency, it produces more heat and accordingly the extraction efficiency thereof is reduced due to uneven current dispersion and heat accumulation.

SUMMARY OF THE INVENTION

The present invention provides a flexible light source device including a substrate, a light emitting device, a molding compound, a dielectric layer, and a metal line. The substrate has a first surface and a second surface opposite to the first surface, and the substrate has a first opening. The light emitting device is disposed on the first surface of the substrate and covers the first opening. The molding compound is located above the first surface of the substrate and covers the light emitting device. The dielectric layer is disposed on the second surface of the substrate and covers the sidewall of the first opening. It should be noted that the dielectric layer has a second opening which exposes part of the light emitting device. The metal line is disposed on the dielectric layer and is electrically connected to the light emitting device via the second opening in the dielectric layer.

The present invention also provides a fabrication method of a flexible light source device. The fabrication method includes following steps. First, a substrate is provided, wherein the substrate has a first surface and a second surface opposite to the first surface. Then, a light emitting device is disposed on the first surface of the substrate. Next, a molding compound is formed on the first surface of the substrate to cover the light emitting device. Thereafter, a first opening is formed on the second surface of the substrate, wherein the first opening exposes part of the light emitting device. Next, a dielectric layer is formed on the second surface of the substrate, and the dielectric layer is filled into the first opening. After that, a second opening is formed in the dielectric layer, and a metal line is formed on the dielectric layer, wherein the metal line is electrically connected to the light emitting device via the second opening.

As described above, in the present invention, a substrate and a molding compound are adopted in the flexible light source device and accordingly a high flexibility and a slim appearance of the flexible light source device are achieved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
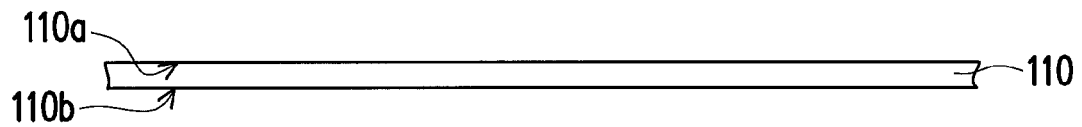
FIGS. 1A~1I are flowcharts illustrating a fabrication method of a flexible light source device according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

The present invention provides a flexible light source device having a high flexibility and a slim appearance. The present invention also provides a fabrication method for fabricating a flexible light source device having a high flexibility and a slim appearance.

FIGS. 1A~1I are flowcharts illustrating a fabrication method of a flexible light source device according to an embodiment of the present invention. In the present embodiment, the fabrication method of the flexible light source device 100 includes following steps. First, referring to FIG. 1A, a substrate 110 is provided, wherein the substrate 110 has a first surface 110a and a second surface 110b opposite to the first surface 110a. Preferably, the substrate 110 is a flexible transparent substrate, and the flexible transparent substrate is made of a polymer material, such as polyimide (PI), polyurethane (PU), or silicon rubber, wherein the flexible radius of the flexible transparent substrate is greater than or equal to 5 cm.

Figure 1B:
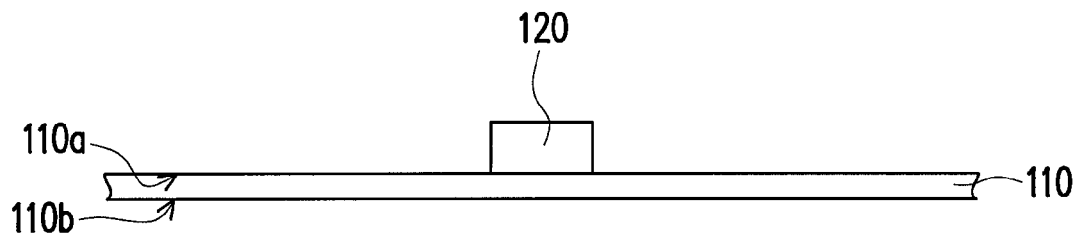

Then, referring to FIG. 1B, a light emitting device 120 is disposed on the first surface 110a of the substrate 110. In an exemplary embodiment of the present invention, the light emitting device 120 may be a light emitting diode (LED) or other suitable light source. In addition, the light emitting device 120 may be disposed on the first surface 110a of the substrate 110 through a die bonding process or other suitable methods.

Figure 1C:
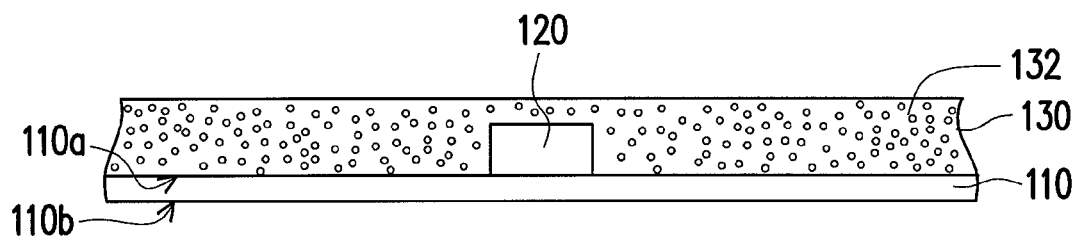

Next, referring to FIG. 1C, a molding compound 130 is formed on the first surface 110a of the substrate 110 to cover the light emitting device 120. The molding compound 130 is usually made of a material with its transmittance over 99%. In the present embodiment, the molding compound 130 may be silicone. In order to allow the light beams emitted by the light emitting device 120 to have a wider divergence angle, preferably, the molding compound 130 further contains optical diffusing particles 132 evenly distributed therein. To be specific, when a light beam emitted by the light emitting device 130 encounters the optical diffusing particles 132 evenly distributed in the molding compound 130, the light beam is refracted or dispersed so that it leaves its original path and is output from a different direction. As a result, the light beam emitted by the light emitting device 130 can irradiate a wider area and angle, and accordingly, a uniform light source can be provided.

Figure 1D:
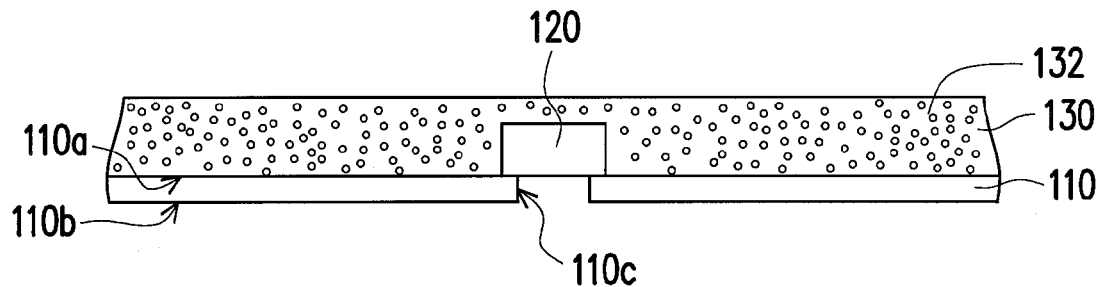

After that, referring to FIG. 1D, a first opening 110c is formed on the second surface 110b of the substrate 110, wherein the first opening 110c exposes part of the light emitting device 120. In the present embodiment, the first opening 110c may be formed through laser drilling, etching, or other suitable methods.

Figure 1E:
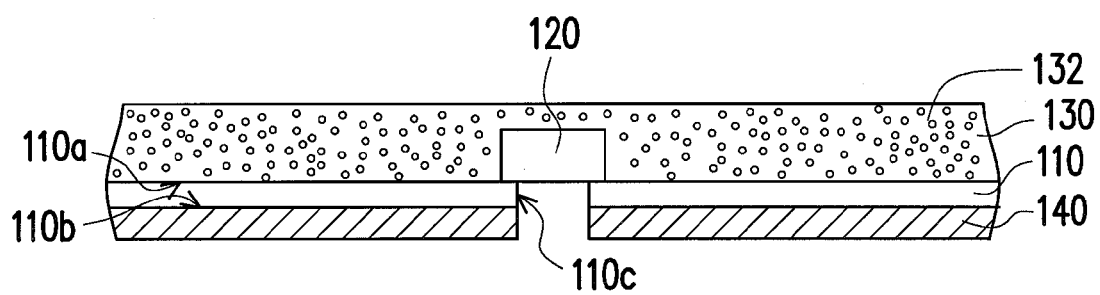

In an exemplary embodiment of the present invention, in order to improve the extraction efficiency of the flexible light source device, a reflective film 140 may be further formed on the second surface 110b of the substrate 110, as shown in FIG. 1E. Namely, after the step illustrated in FIG. 1C, the reflective film 140 is first formed on the second surface 110b of the substrate 110, and then the first opening 110c is formed in both the substrate 110 and the reflective film 140. As a result, the structure illustrated in FIG. 1E is formed. The material of the reflective film 140 may be a metal layer, a reflective material stack layer, or other material with high reflectivity.

Figure 1F:
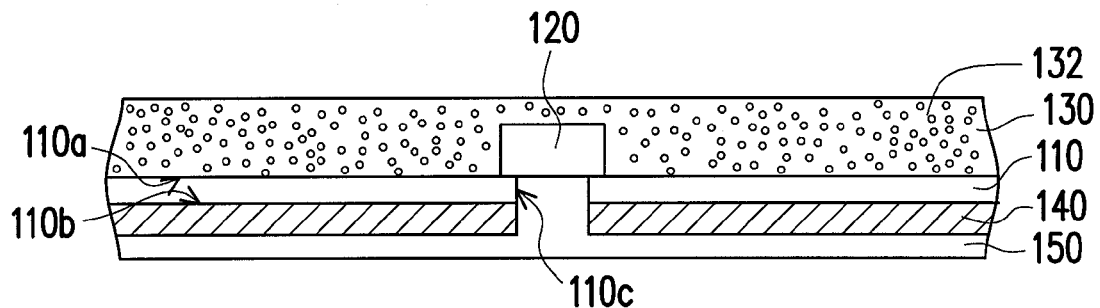

Thereafter, referring to FIG. 1F, a dielectric layer 150 is formed on the second surface 110b of the substrate 110, and the dielectric layer 150 is filled into the first opening 110c. The dielectric layer 150 is mainly used for electrically separating the reflective film 140 and a subsequently formed metal line.

Figure 1G:
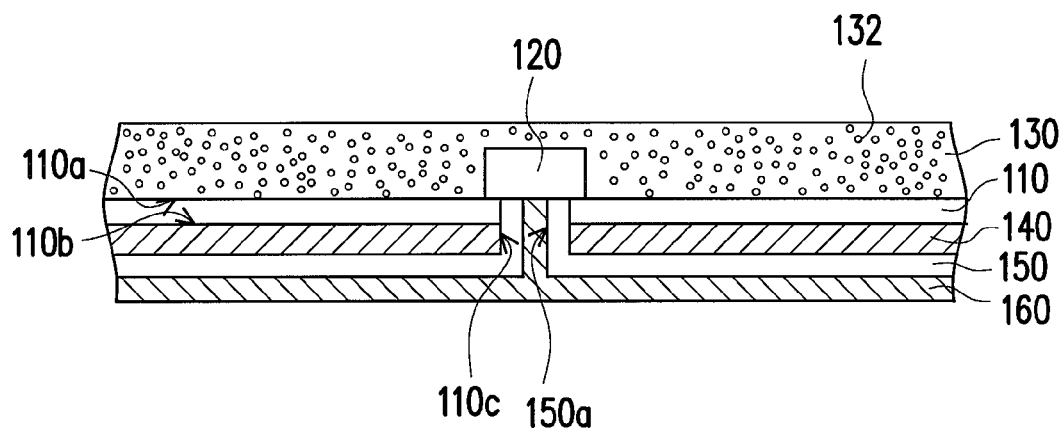

Next, referring to FIG. 1G, a second opening 150a is formed in the dielectric layer 150, and a metal line 160 is formed on the dielectric layer 150, wherein the metal line 160 is electrically connected to the light emitting device 120 via the second opening 150a. Due to the existence of the dielectric layer 150, short circuit between the metal line 160 and the reflective film 140 is prevented.

Figure 1H:
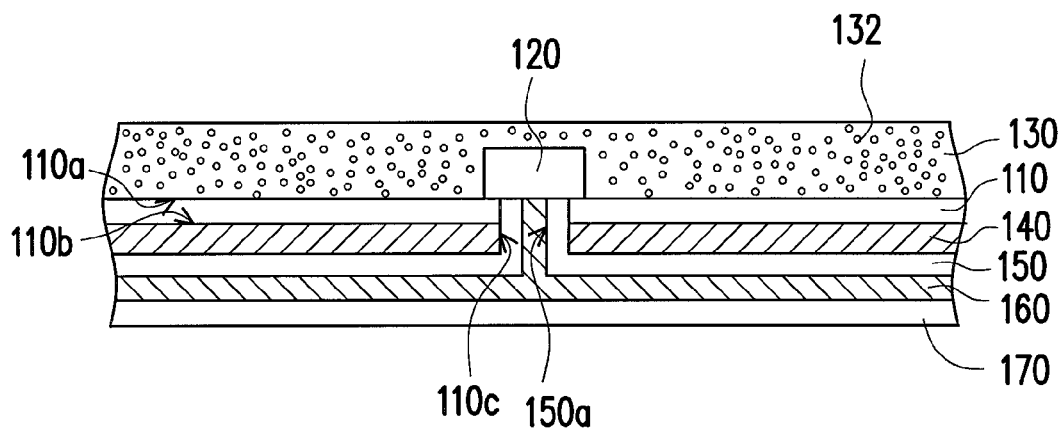

In an exemplary embodiment of the present invention, a heat conducting material 170 may be selectively attached above the second surface 110b of the substrate 110 in order to improve the performance in heat dissipation, wherein the heat conducting material 170 covers the metal line 160, as shown in FIG. 1H. The heat conducting material 170 can quickly disperse the heat produced during the operation of the light emitting device 120 so that the light emitting efficiency of the light emitting device 120 will not be reduced due to heat accumulation. The heat conducting material 170 may be made of a metal film or a polymer composite material.

Figure 1I:
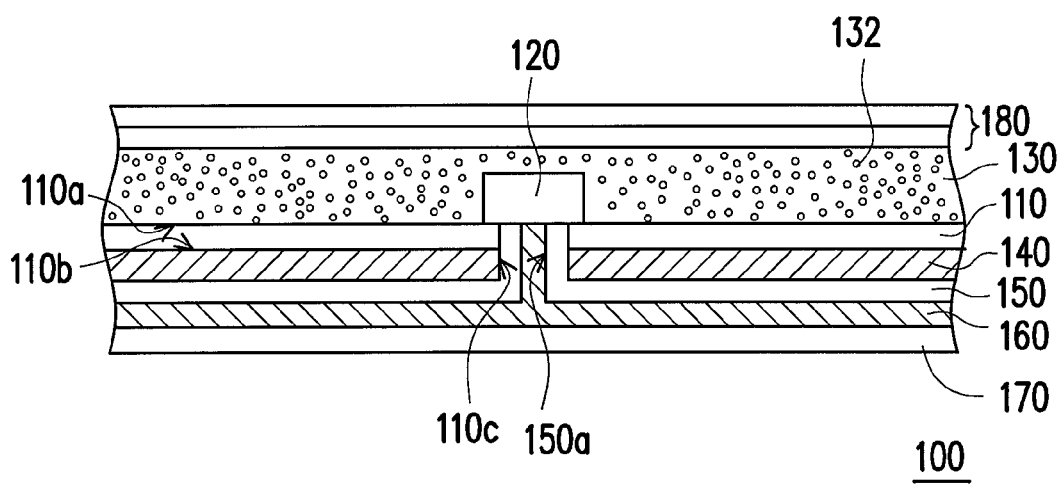

Additionally, in order to improve the light mixing effect, an optical film set 180 may be further formed on the molding compound 130 after foregoing steps are completed, as shown in FIG. 1I. The optical film set 180 may be a diffuser, a brightness enhancement film, a prism sheet, or a combination of foregoing elements. Preferably, the difference of refractive index between the molding compound 130 and the optical film set 180 is smaller than or equal to 0.3. In the present embodiment, the optical film set 180 may be directly attached to the surface of the molding compound 130 with an adhesive to achieve a no-gap tightly attached state between the optical film set 180 and the molding compound 130, so that a slim appearance and a brightness uniformity of over 80% of the flexible light source device 100 can be achieved.

It should be mentioned that in the embodiment described above, due to the existence of the optical diffusing particles 132 in the molding compound 130, a good dispersion or diffusion effect of the light beam emitted by the light emitting device 120 can be achieved when the light beam passes through the molding compound 130. Thus, in the present embodiment, the optical film set 180 can be directly attached to the surface of the molding compound 130 without having to be kept a certain distance away from the light emitting device 120 to achieve the uniform light emitting effect. Accordingly, the thickness of the flexible light source device 100 in the present embodiment is greatly reduced.

Only one light emitting device is illustrated as an example in the drawings of foregoing embodiment. Substantially, a plurality of light emitting devices 120 arranged in an array and metal lines 160 respectively disposed corresponding to the light emitting devices 120 are usually disposed on the substrate 110 to form a light source in a specific shape. However, the numbers of the light emitting devices and other elements are not limited in the present invention and which can be determined and adjusted according to the actual design.

Below, the structure of the flexible light source device fabricated through the fabrication method described above will be described in detail with reference to another embodiment of the present invention.

Referring to FIG. 1I, in the present embodiment, the flexible light source device 100 includes a substrate 110, a light emitting device 120, a molding compound 130, a dielectric layer 150, and a metal line 160. The substrate 110 has a first surface 110a and a second surface 110b opposite to the first surface 110a, and the substrate 110 has a first opening 110c. The light emitting device 120 is disposed on the first surface 110a of the substrate 110 and covers the first opening 110c. The molding compound 130 is located above the first surface 110a of the substrate 110 and covers the light emitting device 120. The dielectric layer 150 is disposed on the second surface 110b of the substrate 110 and covers the sidewall of the first opening 110c. It should be noted that the dielectric layer 150 has a second opening 150a which exposes part of the light emitting device 120. Besides, the metal line 160 is disposed on the dielectric layer 150, and the metal line 160 is electrically connected to the light emitting device 120 via the second opening 150a in the dielectric layer 150.

In the present embodiment, the substrate 110 may be a flexible transparent substrate, and the flexible transparent substrate may be made of a polymer material, such as polyimide (PI), polyurethane (PU), or silicon rubber. Preferably, the flexible radius of the flexible transparent substrate is greater than or equal to 5 cm. The light emitting device 120 may be a LED or other suitable light source.

The molding compound 130 is used for protecting the light emitting device 120. Preferably, the transmittance of the molding compound 130 is over 99%. In the present embodiment, the molding compound 130 may further contain optical diffusing particles 132 evenly distributed therein. The optical diffusing particles 132 can effectively help the light beams emitted by the light emitting device 120 to form a uniform light source.

In order to improve the extraction efficiency of the flexible light source device 100, in the present embodiment, the flexible light source device 100 further includes a reflective film 140 disposed between the substrate 110 and the dielectric layer 150. The reflective film 140 may be made of a metal layer, a reflective material stack layer, or other material with high reflectivity.

In the present embodiment, the flexible light source device 100 further includes a heat conducting material 170 which is disposed above the second surface 110b of the substrate 110 and covers the metal line 160. The heat conducting material 170 improves the heat dissipation performance of the substrate 110 so that the light emitting efficiency of the light emitting device 120 will not be reduced due to heat accumulation. The heat conducting material 170 may be made of a metal film, a polymer composite material, or other material with high heat dissipation ability.

In the present embodiment, the flexible light source device 100 may further include an optical film set 180 disposed on the molding compound 130. The optical film set 180 may be directly attached to the molding compound 130 with an adhesive to achieve a no-gap bonding between the two. The optical film set 180 may be a diffuser, a brightness enhancement film, a prism sheet, or a combination of foregoing elements. Preferably, the difference of refractive index between the molding compound 130 and the optical film set 180 is smaller than or equal to 0.3.

Because the molding compound 130 contains the optical diffusing particles 132 evenly distributed therein, the light beam emitted from the molding compound 130 presents a uniform state. Thus, the optical film set 180 may be directly attached to the molding compound 130 without being kept a certain distance away from the same. As a result, the flexible light source device 100 in the present embodiment can achieve a good light mixing effect without any light guide plate, and at the same time, a slim appearance thereof can be achieved.

As described above, in the present invention, a substrate and a molding compound are adopted such that the light emitting efficiency of the flexible light source device can be improved and a high flexibility and a slim appearance of the same can be achieved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flexible light source device, comprising:
   a substrate, having a first surface and a second surface opposite to the first surface, wherein the substrate has a first opening;
   a light emitting device, disposed on the first surface of the substrate and covering the first opening;
   a molding compound, located above the first surface of the substrate and covering the light emitting device;
   a dielectric layer, disposed on the second surface of the substrate and covering a sidewall of the first opening, wherein the dielectric layer has a second opening which exposes a part of the light emitting device; and
   a metal line, disposed on the dielectric layer, wherein the metal line is electrically connected to the light emitting device via the second opening in the dielectric layer.

2. The flexible light source device according to claim 1, wherein the molding compound comprises optical diffusing particles distributed therein.

3. The flexible light source device according to claim 1 further comprising a reflective film disposed between the substrate and the dielectric layer.

4. The flexible light source device according to claim 3, wherein the reflective film comprises a metal layer or a reflective material stack layer.

5. The flexible light source device according to claim 1 further comprising a heat conducting material which is disposed above the second surface of the substrate and covers the metal line.

6. The flexible light source device according to claim 5, wherein the heat conducting material comprises a metal film or a polymer composite material.

7. The flexible light source device according to claim 1 further comprising an optical film set disposed on the molding compound.

8. The flexible light source device according to claim 7, wherein the optical film set is directly attached to a surface of the molding compound.

9. The flexible light source device according to claim 7, wherein a difference of refractive index between the molding compound and the optical film set is smaller than or equal to 0.3.

10. The flexible light source device according to claim 7, wherein the optical film set comprises a diffuser, a brightness enhancement film, a prism sheet, or a combination thereof.

11. The flexible light source device according to claim 1, wherein the substrate is a flexible transparent substrate.

12. The flexible light source device according to claim 11, wherein a flexible radius of the flexible transparent substrate is greater than or equal to 5 cm.

13. The flexible light source device according to claim 11, wherein a material of the flexible transparent substrate is a polymer material.

14. The flexible light source device according to claim 1, wherein the light emitting device is a light emitting diode (LED).

15. A fabrication method of a flexible light source device, comprising:
    providing a substrate, wherein the substrate has a first surface and a second surface opposite to the first surface;
    disposing a light emitting device on the first surface of the substrate;
    forming a molding compound on the first surface of the substrate to cover the light emitting device;
    forming a first opening on the second surface of the substrate, wherein the first opening exposes a part of the light emitting device;
    forming a dielectric layer on the second surface of the substrate, and filling the dielectric layer into the first opening;
    forming a second opening in the dielectric layer; and
    forming a metal line on the dielectric layer, wherein the metal line is electrically connected to the light emitting device via the second opening.

16. The fabrication method according to claim 15, wherein the molding compound further comprises optical diffusing particles distributed therein.

17. The fabrication method according to claim 15, wherein before forming the dielectric layer, the fabrication method further comprises:
    forming a reflective film on the second surface of the substrate; and
    forming the first opening in the substrate and the reflective film.

18. The fabrication method according to claim 15, wherein after forming the metal line on the dielectric layer, the fabrication method further comprises attaching a heat conducting material above the second surface of the substrate and covering the metal line.

19. The fabrication method according to claim 15 further comprising forming an optical film set on the molding compound.

20. The fabrication method according to claim 19, wherein the optical film set is directly attached to a surface of the molding compound.

21. The fabrication method according to claim 15, wherein the light emitting device is disposed on the first surface of the substrate through a die bonding process.

* * * * *